United States Patent [19]
Bunshah et al.

[11] Patent Number: 5,747,118
[45] Date of Patent: May 5, 1998

[54] PLASMA ENHANCED CHEMICAL TRANSPORT PROCESS FOR FORMING DIAMOND FILMS

[75] Inventors: Rointan F. Bunshah, Playa Del Rey; Hans J. Doerr, Westlake Village; Shyankay Jou, Santa Monica, all of Calif.

[73] Assignee: The Regents of the University of California, Oakland, Calif.

[21] Appl. No.: 510,483

[22] Filed: Aug. 2, 1995

Related U.S. Application Data

[63] Continuation of Ser. No. 223,693, Apr. 6, 1994, abandoned.

[51] Int. Cl.$^6$ .................. B05D 3/06; C23C 16/00
[52] U.S. Cl. .................. 427/577; 427/249; 427/122
[58] Field of Search .................. 427/577, 249, 427/122; 423/446; 428/408; 117/929

[56] References Cited

U.S. PATENT DOCUMENTS

| | | | |
|---|---|---|---|
| 3,175,885 | 3/1965 | Brinkman et al. | |
| 4,816,291 | 3/1989 | Desphandey et al. | |
| 4,961,958 | 10/1990 | Desphandey et al. | |
| 5,051,785 | 9/1991 | Beetz, Jr. et al. | 357/4 |
| 5,104,634 | 4/1992 | Calcote | 423/446 |
| 5,126,206 | 6/1992 | Gang et al. | 428/408 |
| 5,186,973 | 2/1993 | Gang et al. | 427/590 |
| 5,382,809 | 1/1995 | Nishibayashi et al. | 257/77 |

FOREIGN PATENT DOCUMENTS 1-192794  8/1989  Japan .

OTHER PUBLICATIONS

John C. Angus et al., Growth of Diamond Seed Crystals by Vapor Deposition, *Journal of Applied Physics*, vol. 19, No. 6, pp. 2915–2922.

B.V. Derjaguin, et al., Filamentary Diamond Crystals, *Journal of Crystal Growth* 2 (1968), pp. 380–384.

C.V. Desphandey, et al., Diamond and diamondlike films: Deposition processes and properties, *J. Vac. Sci. Technol. A*, vol. 7, No. 3, May/Jun. 1989, pp. 2294–2302.

Naoji Fujimori, et al., Properties of Boron–Doped Epitaxial Diamond Films, *Japanese Journal of Applied Physics*, vol. 29, No. 5, May 1990, pp. 824–827.

M.W. Geis, et al., Diamond Cold Cathode. *IEEE Electron Device Letters*, vol. 12, No. 8, Aug. 1991, pp. 456–459.

Michael W. Geis, Diamond Transistor Performance and Fabrication, *Proceedings of the IEEE*, vol. 79, No. 5, May 1991, pp. 669–676.

(List continued on next page.)

*Primary Examiner*—Roy V. King
*Attorney, Agent, or Firm*—Michael J. Ram; Marvin H. Kleinberg; Marshall A. Lerner

[57] ABSTRACT

A chemical transport process which is enhanced by a plasma formed in a substantially oxygen free hydrogen environment for formation of microcrystalline diamond films at a relatively low deposition temperature and a rate of about 1 μm/hr. The process, performed at 80 to 180 Torr and a current density of about 1 amp/cm$^2$ of substrate, can be scaled to deposit films on large areas. The invention further comprises doped diamond films produced by the process, said product having a well-faceted microcrystalline structure with x-ray diffraction pattern and Raman spectra indicative of a predominately diamond structure. The doped diamond films can function as n-type and p-type semiconductors.

20 Claims, 5 Drawing Sheets

OTHER PUBLICATIONS

Michael W. Geis, et al., Diamond Film Semiconductors, *Scientific American*, Oct. 1992, pp. 84–89.

M.W. Geis, et al., High–conductance, low–leakage diamond Schottky diodes, *Appl. Phys. Lett.*, vol. 63, No. 7, Aug. 1993, pp. 952–954.

Gennady Sh. Gildenblat, et al., The Electrical Properties and Device Applications of Homoepitaxial and Polycrystalline Diamond Films, *Proceedings of the IEEE*, vol. 79, No. 5, May 1991, pp. 647–668.

Paul R. de la Houssaye, Hall mobility and carrier concentration versus temperature for type IIa natural insulating diamond doped with boron by ion implantation, *J. Appl. Phys.*, vol. 71, No. 7, Apr. 1992, pp. 3220–3224.

Mutsukazu Kamo, et al., Diamond Synthesis from Gas Phase in Microwave Plasma, *Journal of Crystal Growth*, vol. 62 (1983), pp. 642–644.

Michael A. Kelly, et al., Diamond growth by a new method based upon sequential exposure to atomic carbon and hydrogen, *Appl. Phys. Lett.*, vol. 60, No. 20, May 1992, pp. 2502–2504.

Hideo Kiyota, et al., Fabrication of Metal–Insulator–Semiconductor Devices Using Polycrystalline Diamond Film, *Japanese Journal of Applied Physics*, vol. 30, No. 12A, Dec. 1991, pp. L2015–L2017.

Kazuaki Kurihara, et al., High rates synthesis of diamond by dc plasma jet chemical vapor deposition, *Appl. Phys. Lett.*, vol. 52, No. 6, Feb. 1988, pp. 437–438.

Seiichiro Matsumoto, et al., Vapor Deposition of Diamond Particles from Methane, *Japanese Journal of Applied Physics*, vol. 21, No. 4, Apr. 1982, pp. L183–L185.

Seiichiro Matsumoto, et al., Growth of diamond particles from methane–hydrogen gas, *Journal of Materials Science*, 17, (1982), pp. 3106–3112.

Seiichiro Matsumoto, Chemical vapour deposition of diamond in RF glow discharge, *Journal of Materials Science Letters*, 4, (1985), pp. 600–602.

Morito Matsuoka, et al., Diamond synthesis by sputtering, *J. Vac. Sci. Technol. A.*, vol. 11, No. 6, Nov./Dec. 1993, pp. 2994–3000.

Juan Manuel Mendez, et al., Optical properties of amorphous carbon thin films prepared by plasma deposition in a graphite hollow cathode, *Thin Solid Films*, 220 (1992), pp. 125–131.

K. Miyata, et al., Metal/intrinsic diamond/semiconducting diamond junction diodes fabricated from polycrystalline diamond films, *J. Appl. Phys.*, vol. 73, No. 9, May 1993, pp. 4448–4456.

Ken Okano, et al., Synthesis of n–Type Semiconducting Diamond Film using Diphosphorus Pentaoxide as the Doping Source, *Appl. Phys. A*, vol. 51, (1990, pp., 344–346.

Ken Okano, et al., Characterization of semiconducting diamond film and its application to electronic devices, *Thin Solid Films*, vol. 206, (1991), pp. 183–187.

Ken Okano, et al., Characterization of Boron–Doped Diamond Film, *Japanese Journal of Applied Physics*, vol. 28, No. 6, Jun. 1989, pp. 1066–1071.

K. Okumura, et al., Lithium doping and photoemission of diamond thin films, *Appl. Phys. Lett.*, vol. 57, No. 18, Oct. 1990, pp. 1907–1909.

W. Piekarczyk, et al., Diamond Deposition by Chemical Vapor Transport with Hydrogen in a Closed System, *Journal of Crystal Growth*, vol. 106 (1990), pp. 279–293.

K.V. Ravi, et al., Silicon on Insulator Technology Using CVD Diamond Films, *The Electrochemical Society Proceedings*, vol. 89, No. 12, pp. 24–37.

J.L. Robertson, et al., Epitaxial Growth of Diamond Films on Si(111) at Room Temperature by Mass–Selected Low–Energy C+ Beams, *Science*, vol. 243, Feb. 1989, pp. 1047–1050.

Atsuhito Sawabe, et al., Growth of diamond thin films by electron assisted chemical vapor deposition, *Appl. Phys. Lett.*, vol. 46, No. 2, Jan. 1985, pp. 146–147.

Atsuhito Sawabe, et al., Growth of Diamond Thin Films in a DC Discharge Plasma, *Applied Surface Science*, 33/34, (1988), pp. 539–545.

B.V. Spitsyn, et al., Vapor Growth of Diamond on Diamond and Other Surfaces, *Journal of Crystal Growth*, vol. 52, (1981), pp. 219–226.

M.C. Salvadori, et al., Diamond synthesis by microwave plasma chemical vapor deposition using graphite as the carbon source, *Appl. Phys. Lett.*, vol. 59, No. 19, Nov. 1991, pp. 2386–2388.

G.S. Sandhu, et al., Doping of diamond by coimplantation of carbon and boron, *Appl. Phys. Lett.*, vol. 55, No. 14, Oct. 1989, pp. 1397–1399.

B. Singh, et al., Hollow cathode plasma assisted chemical vapor deposition of diamond, *Appl. Phys. Lett.*, vol. 52, No. 20, May 1988, pp. 1658–1660.

Atsuhito Sawabe, et al., Growth of diamond thin films by electron–assisted chemical vapour deposition and their characterization, *Thin Solid Films*, 137, (1986), pp. 89–99.

Hiromu Shiomi, et al., Epitaxial Growth of High Quality of Diamond Film by the Microwave Plasma–Assisted Chemical–Vapor–Deposition Method, *Japanese Journal of Applied Physics*, vol. 29, No. 1, Jan. 1990, pp. 34–40.

Hiromu Shiomi, et al., Field–Effect Transistors using Boron–Doped Diamond Epitaxial Films, *Japanese Journal of Applied Physics*, vol. 28, No. 12, Dec. 1989, pp. L2153–L2154.

Robert J. Trew, et al., The Potential of Diamond and SiC Electronic Devices for Microwave and Millimeter–Wave Power Applications, *Proceedings of the IEEE*, vol. 79, No. 5, May 1991, pp. 598–620.

W. Tsai, et al., Diamond MESFET Using Ultrashallow RTP Boron Doping, *IEEE Electron Device Letters*, vol. 12, No. 4, Apr. 1991, pp. 157–159.

C. Wang, et al., Cold Field Emission From CVD Diamond Films Observed in Emission Electron Microscopy, *Electronics Letters*, vol. 27, No. 16, Aug. 1991, pp. 1459–1461.

Max N. Yoder, Diamond: Its Impact on Electronics, *Naval Research Reviews*, 1992, pp. 17–21.

Carl R. Zeisse, et al., An Ion–Implanted Diamond Metal–Insulator–Semiconductor Field–Effect Transistor, *IEEE Electron Device Letters*, vol. 12, No. 11, Nov. 1991, pp. 602–604.

X.K. Zhang, et al., Boron Doping of Diamond Films by $B_2O_3$ Vaporization, *Phys. Stat. Sol. (a)*, 133, (1992), pp. 377–383.

PLASMA ENHANCED CHEMICAL TRANSPORT PROCESS FOR FORMING DIAMOND FILMS

This is a continuation of application Ser. No. 08/223,693, filed Apr. 6, 1994, now abandoned.

BACKGROUND

The present invention relates to a process, and unique operating parameters, for the production of microcrystalline diamond films using transport of carbon from a solid carbon cathode to a substrate in a hydrogen plasma, the process being performed in a vacuum chamber at subatmospheric pressures. The invention further relates to a process for the production of doped diamond films using a variety of dopants. Still further, the invention relates to doped and undoped microcrystalline diamond films which have physical, optical and electrical properties comparable to those prepared by prior art methods such as CVD but which are prepared under less severe commercially viable operating conditions. Still further, the invention relates to new and unique doped diamond films that have n-type and p-type semiconductor properties.

Carbon exists in two different natural crystallographic states, as well as two intermediate amorphous forms. Graphite is a soft material (hardness=12 HV) having a planar hexagonal crystal structure, a significant anisotrophy and a density of 2.6 g/cm$^3$. The intermediate carbon materials, referred to as "amorphous" and "amorphic carbon", have diamond-like properties but lack a long-range ordered structure or include islands of sp$^2$-bonded (hexagonal) graphite linked by disordered diamond-type sp$^3$-bonds. On the other hand, diamond, the hardest material known to man (hardness=10,000 HV), has a density of 3.5 g/cm3 and a cubic structure, described as a tetrahedral coordination of C(sp$^3$) atoms. Besides their physical, optical and electrical properties, diamond films are desirable because of IR transmissibility, superior wear characteristics and chemical resistivity.

In the past, diamond films have been prepared under a wide range of pressures using chemical vapor deposition techniques (CVD), plasma assisted chemical vapor deposition (PACVD) and physical vapor deposition (PVD). W. G. Eversole, U.S. Pat. Nos. 3,030,187 and 3,030,188 (1962) demonstrated low pressure deposition of diamond. B. V. Derjaguin, D. V. Fedoseev, V. M. Lykualiovich, B. V. Spitsyn and A. V. Lavreutyev, *J. Cryst. Growth*, 2,380 (1968), demonstrated the use of a closed system, low pressure, chemical transport method using a gaseous hydrocarbon source to produce diamond films and crystals. J. C. Angus, H. A. Will and W. S. Steinko, *J. Appl. Phys.*, 39(6), 2915 (1968) deposited diamond from vapor onto diamond powder by decomposing $C_xH_y$ at 1050° C. and 0.3 Torr pressure. S. Matsumoto, Y. Sato, M. Tsutsumi and N. Setaka, *J. Mater. Sci.*, 17,3106 (1982); S. Matsumoto, Y. Sato, M. Kamo and N. Setaka, *Jap. J. Appl. Phys.*, 21,L183 (1982) used a tungsten filament heated to 2000° C. in a hydrogen-methane mixture to generate diamond growth. Matsumoto has also demonstrated the use of radio frequency and microwave plasma to generate atomic hydrogen to enhance diamond growth (S. Matsumoto, *J. Mater. Sci. Lett.*, 4,600 (1985); S. Matsumoto, T. Lobayashi, M. Hino, T. Ishigaki, Y. Moriyoshi, pp. 2,458–62, *Proceedings of the 8th International Symposium of Plasma Chemistry*, Vol. 1, Tokyo, Japan, Aug. 31–Sep. 4, 1987. Edited by K. Akashi and A. Kinbara; M. Kamo, T. Sato, S. Matsumoto and N. Setaka, *J. Cryst. Growth*, 62,642–644 (1983)).

While these techniques require the use of a hydrocarbon gas, they demonstrated the importance of an atomic hydrogen medium to generate diamond precursors, to preferentially etch away undesirable graphite nuclei and to stabilize the diamond surface. Sawabe and Inuzuka A. Sawabe and T. Inuzuka, *Thin Solid Films*, 137, 89 (1986) enhanced the growth of the diamond film deposited by hot filament CVD by electron bombardment of the substrate surface. B. Singh, O. Mesker, A. W. Levine, Y. Aric, *Appl. Phys. Lett.*, 52,1658 (1988) demonstrated the ability to deposit a diamond film at source-to-substrate distances up to 10 cm using a hollow cathode to dissociate the hydrocarbon feed gas.

High pressure arc discharge (150–760 Torr) techniques allow conversion of hydrocarbon gases to diamond with growth rates of a few micrometers per hour. K. Kurihara, K. Sasaki, M. Kawarada and N. Koshina, *Appl. Phys. Lett.*, 52,437 (1988).

Y. Hirose and N. Kondo, Program and Abstracts, *Japan Applied Physics*, 1988 Meeting, Mar. 29, 1988, p. 34; Y. Hirose, *Proc. of the First International Conference on the New Diamond Science and Technology*, Tokyo, Japan, Oct. 24–26, 1988 formed diamond films using an oxygen/acetylene torch.

C. V. Deshpandey, R. F. Bunshah and Hans J. Doerr, U.S. Pat. No. 4,961,958 (1990) disclosed the use of a high voltage electron beam to heat and evaporate a grounded carbon target to form a diamond film on a floating or negatively biased substrate spaced up to 20 cm from the carbon target in a hydrogen/argon plasma at low pressures (1–5 mTorr). A smooth, high reflective, brownish to dark blue appearing mixture of predominantly nanocrystalline diamond phase with a small amount of non-diamond phase was formed.

At present, the major commercial application for diamond films is as wear protection coatings on tools used for machining non-ferrous (mostly high-silicon aluminum) alloys. However, a developing commercial application is to form protective coatings on data storage media and pickup heads. The magnetic permeability and optical clarity of diamond films make them uniquely suitable for this application. The harder surface allows elimination of the air cushion separating the pickup head from the media surface. Direct contact with the coated media surface allows higher data storage density and reduced disk speeds because a reduced field is necessary to read or write the data. Additionally, the contact allows improved separation of neighboring signal bits.

While its reactivity with ferrous metals at elevated temperatures limits the utility of diamond films for ferrous metal machining and certain high temperature applications in air, the chemical stability against aggressive acids, bases and all known solvents make them uniquely suitable for coating of chemical process equipment, and because of their chemical stability, diamond films are considered to be biocompatible and excellent coatings for human body implants.

Diamond is a wide band gap material (Diamond=5.45 eV; silicon is 1.12 eV) with a high resistivity of $10^{16}$ Ωcm. Because these materials have a high breakdown voltage they are useful as insulators for semiconductor applications. Diamond Schottky devices can operate reliably at temperatures up to 700° C. as compared to 150° C. for conventional silicon devices. Additionally, because of the high thermal conductivity of diamond films ($\geq 6.50$ W/cmK) these materials are excellent heat sinks. Diamond also has a smaller thermal expansion coefficient (1–1.5 ppm) than silicon (2.6 ppm) or GaAs (5.9 ppm).

Because of the negative electron affinity, a diamond cathode in a cathode ray tube will operate at one-fifth of the current density required by conventional thermionic or hot cathode devices and thus can provide a cooler, more powerful cathode ray tube, vacuum tube amplifier and cathode for large area displays. Additionally, these films are transparent to visible and IR light and, because of their refractive index (1.6–2.4), they can be used to reduce reflective losses in infrared optics and solar cells.

Because of the high carrier mobility, high saturation velocity and dielectric breakdown of diamond, diamond films have been proposed for high frequency, high power devices and high temperature semiconductors. Owing to the low leakage current a diamond film can be used as a photo-detector without making a p-n junction.

While diamond films are believed to be useful for certain protective and optical applications, doped diamond films can be expected to have additional unique properties which would make them candidates for microelectronic applications such as Schottky diodes, photodiodes, semiconductors, transistors, low temperature electron emitting cathodes, non-volatile RAMs and integrated circuits. Diffusion and ion implantation processes have been tried to produce diamond films doped with boron, lithium, potassium, arsenic, antimony, carbon, krypton and xenon. These doped materials could have unique electrical properties and therefore would find application as photodiodes, semiconductors and high power density cathodes for large area displays. The production of p-type boron doped diamond was demonstrated by solid state rapid thermal processing at 1400° C. (W. Tsai, M. Delfino, D. Hodul, M. Riaziat, L. Y. Ching, G. Reynolds and C. B. Copper, III, "Diamond MESFET Using Ultrashallow RTP Boron Doping," *IEEE Electron Devices Lett.*, 12(4), 157–159 (1991); W. Tsai, et al., "Boron Doping of Diamond via Solid State Diffusion," *Proc. Int. Conf. New Diamond Sci. Technology,* (Crystal City, Va.), 1990) Phosphorus doped diamond has been claimed but the n-type semiconductor effect was not demonstrated. (K. Okano, H. Kiyota, T. Iwasaki, Y. Nakamura, Y. Akiba, T. Kurosu, M. Iida and T. Nakamura, "Synthesis of n-type Semiconducting Diamond Film Using Diphosphorus Pentaoxide As the Doping Source," *Appl. Phys. A.,* 51, 344–346 (1990); K. Okano, T. Iwasaki, H. Kiyota, T. Kurosu and M. Iida, "Characterization of Semiconducting Diamond Film and its Applications to Electronic Devices," *Thin Solid Films,* 206, 183–187 (1991)). Lithium has been doped into diamond using vapor indiffusion at 400°–900° C. (K. Okumura, J. Mort and M. Machokin, "Lithium Doping and Photoemission of Diamond Thin Films," *Appl. Phys. Lett.,* 57(18), 1907–1909 (1990).

Each of these prior art techniques suffered from one or more deficiencies. In particular, they all used hydrocarbons in complex processes (microwave plasma, ARE, DC arc jet) which had a limited range of operating parameters. As an example, hot filament CVD required high temperatures and the size of the usable substrate was relatively small. Likewise, the flame torch process could deposit a film only on a limited surface area and film deposited had a rough surface. Current processes for the production of doped diamond films have not demonstrated formation of films with the expected electronic properties, nor have n-type doped films been produced.

Thus there is a need for a simple, reliable process which can be used to produce high quality microcrystalline diamond films in commercial quantities at a reasonable cost. There is also a need for p- and n-type diamond doping processes for semiconductor devices and applications.

SUMMARY

These needs are met by the present invention which comprises a simple, versatile and low cost chemical transport process which is enhanced by a hydrogen plasma for formation of microcrystalline diamond films at a relatively low deposition temperature and a rate of about 1 µm/hr. The process, performed at 80 to 180 Torr and a current density of about 1 amp/cm$^2$ of substrate, is not limited by the size of the substrate and can be scaled to deposit films on large areas. The invention further comprises undoped and doped diamond films produced by the process, said product having a well-faceted microcrystalline structure with x-ray diffraction pattern and Raman spectra indicative of a predominantly diamond structure. The invention further comprises doped diamond films which function as n-type and p-type semiconductors. In addition to the well-faceted diamond coating, cauliflower and multiple-twinned faceted diamond film morphologies, as well as films of extremely low surface roughness, can also be formed.

DRAWINGS

These and other features, aspects and advantages of the present invention will become better understood with reference to the following description, appended claims, and accompanying drawings, where:

DESCRIPTION

It has been found that a continuous microcrystalline diamond film comparable to that formed by CVD techniques can be deposited on a substrate by using a new process, entitled plasma enhanced chemical transport (PECT), which uses a hydrogen plasma generated between a solid carbon sources and an anode. The system is easy to use and, contrary to the prior art techniques, does not require a continuous feed of precursor materials, such as a hydrocarbon gas. The process transports carbon from a cathode comprising a graphite rod, pyrolitic carbon, carbon cloth or other suitable sources of carbon to a substrate, either located on a carbon anode or floating near the anode, spaced from about 0.4 to about 1.0 cm away. The cathode and the anode and/or substrate serve as the electrodes for the generation of the hydrogen plasma (glow discharge). While a stable plasma can be formed at 60 to 300 Torr, the preferred operating range for the formation of the microcrystalline diamond films is a pressure range of 80 to 180 Torr.

Figure 1:
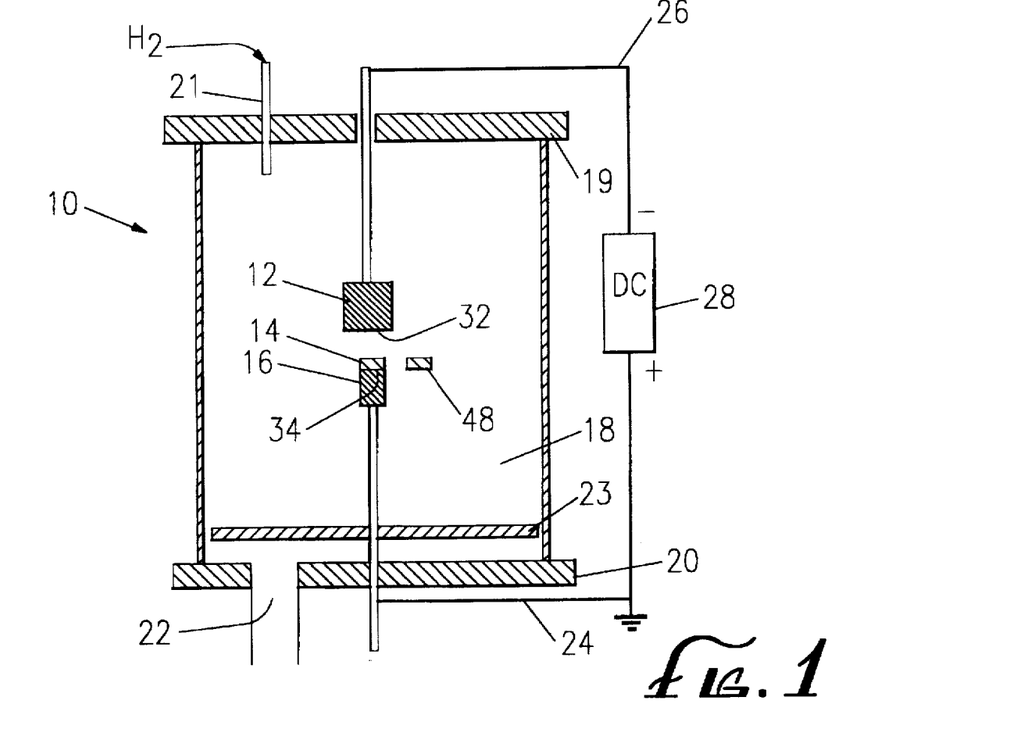
FIG. 1 is a schematic drawing of a diamond film production setup.

FIG. 1 is a schematic drawing of the system 10 used to produce the diamond films of the invention. A carbon/cathode 12 is spaced from the substrate 14 placed on an anode 16. The cathode 12 and anode 16 are enclosed in a chamber 18, such as a Pyrex bell jar, which has a gas inlet line 21 and a vacuum outlet 22, each of which may be valved (not shown) to seal the chamber 18 when the desired vacuum is obtained. The top of the chamber 18 is an electrically floating metal plate 19 and the bottom is a plate 20 grounded with the anode 16. Sealed in the wall of the chamber 18 in an airtight manner are positive and negative electrode leads 24, 26 which are connected to a DC sputtering power supply 28 using appropriate feedthroughs. Under these conditions carbon is released from the cathode by chemical sputtering. Chemical sputtering involves the formation of hydrocarbon species on the cathode surface followed by their release from the surface by thermal desorption and/or momentum transfer. Positioned between the anode 16 and the grounded plate 20 is a Pyrex shield 23 to prevent the ground plate 20 from "seeing" the cathode 12 and forming a glow discharge at the ground plate 20. A separate negatively biased filament (not shown) can be positioned in the chamber near both the cathode 12 and the anode 16 or other external electron or plasma sources, such as an r.f. coil, commonly used to ignite the plasma, can be used to start the discharge 31 at the electrode faces. However, it has been found that the plasma in the system as described can be ignited by the high voltage circuit in the dc power source and an extraneous ignition means is not necessary. Also RF or AC power supplies could be used in place of the DC power supply.

Typical operating conditions are 350 to 470 volts DC at a current of about 0.85 to about 1.2 amps and a pressure of about 80 to 180 Torr in a hydrogen atmosphere. Suitable substrates 14 are divided into three classes: a) lattice matched, chemically compatible materials such as diamond or cubic-BN; b) carbides and carbide forming materials such as Si, Ge, Mo, Ta, W; c) other compounds such as oxides and nitrides, i.e., $Al_2O_3$ and $Si_3N_4$; or d) metals such as Au, Pt, Ni, or Cu. A particular advantage of the PECT process is that a polycrystalline diamond film prepared by other processes or a single crystal substrate, such as natural or synthetic single diamond crystal, can be readily coated with a doped diamond material, thus changing the surface properties of the diamond.

Substrate pretreatments are generally provided to generate nucleation sites. These include polishing with diamond paste or depositing another coating on the surface prior to diamond deposition. High quality diamond films have been produced at a rate of about 1 micrometer per hour using a cathode 12 having a lower face 32 diameter of about 2.5 cm and an anode 16 or substrate with an upper face 34 diameter of about 0.95 cm, the cathode lower face 32 and the anode/substrate upper face 34 being spaced about 0.6 cm apart. The preferred current density, based on the area of the anode upper face 34 is 1 amp/cm$^2$ which is obtained when the voltage is 450V DC and the current is 1.1 amp. However, it has been found that suitable microcrystalline diamond films can be obtained under conditions which vary from the preferred. For example, at higher pressures the current and voltage can be reduced (i.e., 120 Torr, 0.9 amp & 420V). The discharge current and voltage has also been found to vary with the gas pressure and gas temperature. The current delivered to the cathode 12, and, therefore, the substrate 14 size is limited at present by the 600 volt power source 28 available to the inventor. It is expected that the power delivered to the system can be increased by use of a higher capacity power supply without detrimental effect. It is not believed that the maximum preferred current set forth above or the ratio of anode/substrate to cathode surface area is a critical or a limiting factor as long as the current density is maintained in the range of about 0.5 to about 4.0 amp/cm$^2$, with the preferred current density being at about 1 amp/cm$^2$. It is also preferred that the area of the anode/substrate is sufficiently less than the cathode area to keep the potential of the anode/substrate positive with respect to the plasma potential resulting in electron bombardment of the anode/substrate, the said electron bombardment being very useful in the formation of the diamond film.

In order to operate the system 10, a substrate 14 is placed on the anode 16, the chamber 18 is closed, the atmosphere in the chamber 18 is evacuated down to about 20 mTorr, flushed with hydrogen and then brought to the desired operating pressure. The system 10 can then be sealed and operated in a static mode. Alternatively, flowing hydrogen either intermittently or continuously through the chamber during deposition while maintaining the desired pressure or pressure range, can improve somewhat the quality of the film formed.

The system and conditions described above generate continuous microcrystalline diamond films with a clear Raman spectra having a peak at about 1334 cm$^{-1}$ characteristic of crystalline diamond (non-diamond carbon shows a peak at 1580 cm$^{-1}$) and an X-ray spectra typical of crystalline diamond. SEM photomicrographs show diamond films with faceted morphology, multiple twin faceted morphology or cauliflower morphology, depending on operating conditions. The continuous diamond films show (111) and (220) preferred orientations.

Figure 2:
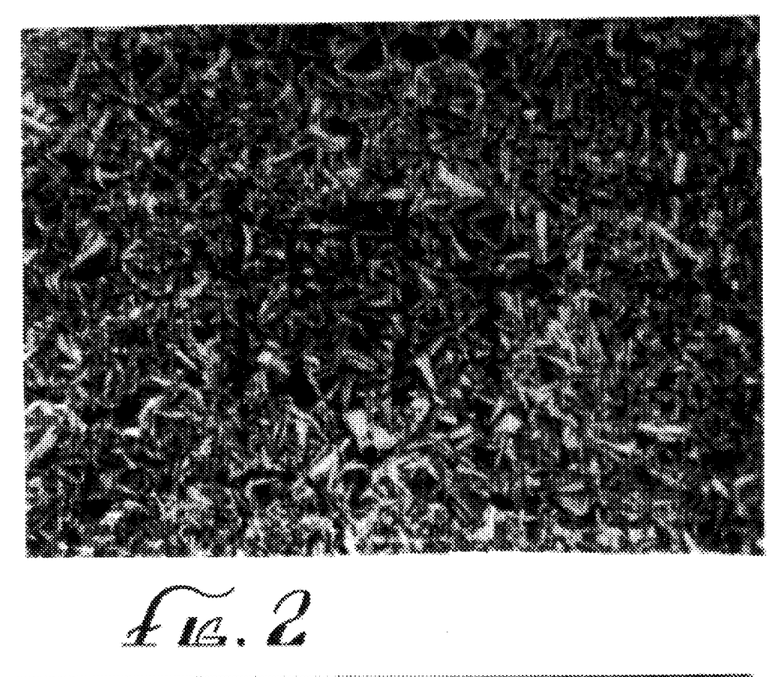
FIG. 2 is an SEM photomicrograph of a well facetted diamond film.
Figure 3:
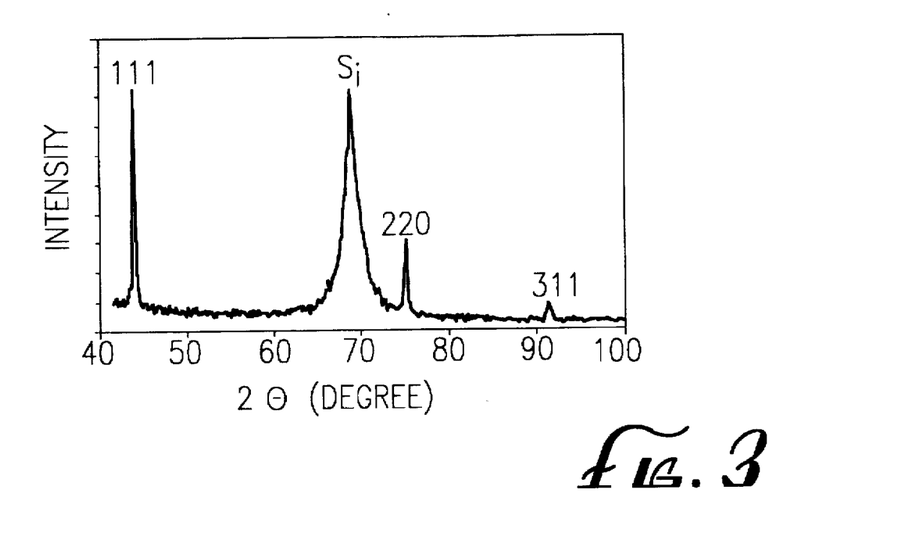
FIG. 3 is a graph showing the X-ray diffraction pattern for the film of FIG. 2.
Figure 4:
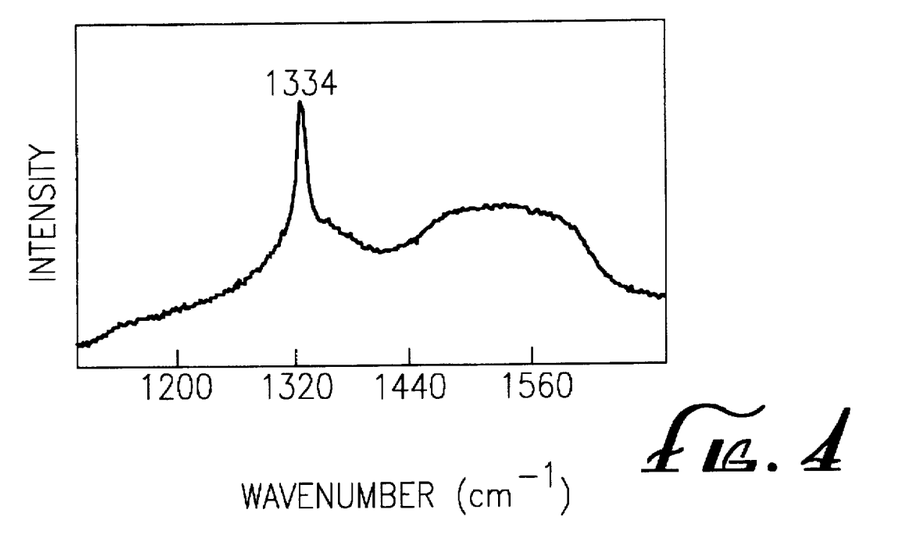
FIG. 4 is a graph showing the Raman spectra for the diamond film of FIG. 2.
Figure 5:
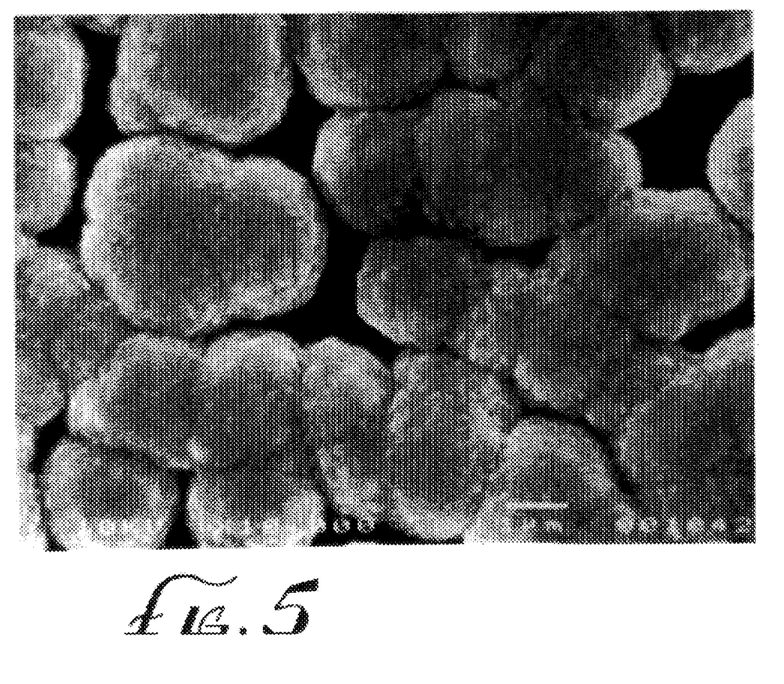
FIG. 5 is an SEM photomicrograph of a cauliflower morphology diamond film.

FIGS. 2, 5, 6 and 7 show diamond films prepared using the PECT process. A microcrystalline well-faceted diamond film, characterized by a greater amount of sp$^3$ bonds, is shown in FIG. 2. FIG. 5 shows a different diamond film morphology referred to as a cauliflower morphology. Both were prepared on a prescratched silicon surface but under different operating conditions. The well faceted film of FIG. 2 was prepared at 1.1 Amp and 100 Torr. The cauliflower morphology of FIG. 5 was produced at the same pressure but at a lower current density (0.8 Amp). The morphology shown resembles CVD diamond coatings obtained at low and high hydrocarbon levels in the H$_2$/hydrocarbon mixtures commonly used in CVD processes, respectively. FIG. 3 shows the X-ray diffraction pattern and FIG. 4 shows the Raman spectra for a typical diamond coating prepared by PECT. The X-ray pattern shows a (111) diamond peak of high intensity as well as very distinct (220) and (311) peaks. The Raman spectra for the well faceted diamond film (FIG. 4), as well as the cauliflower morphology, shows a peak at 1334–1335 cm$^{-1}$ and some amorphous carbon background at 1550 cm$^{-1}$. The full width at half-maximum (FWHM) of the diamond Raman peak was 10.8 cm$^{-1}$.

The different morphologies can also be prepared by holding the power in the electrical discharge fixed, for example at 400±10 watts, while varying the pressure in the chamber. At 70 Torr the cauliflower morphology similar to FIG. 5 is obtained. The preferred faceted morphology of FIG. 2 was obtained at 100 Torr and a well-faceted multiple-twinned morphology is produced at 180 Torr.

It was also found that the growth of the diamond film is not self limiting. At 100 Torr in hydrogen and 1.1 amp at 420±20V DC the growth rate was 1 µm/hr with 5.5 µm thickness deposited in 6 hours and 11 µm thickness in 10 hours.

Figure 6:
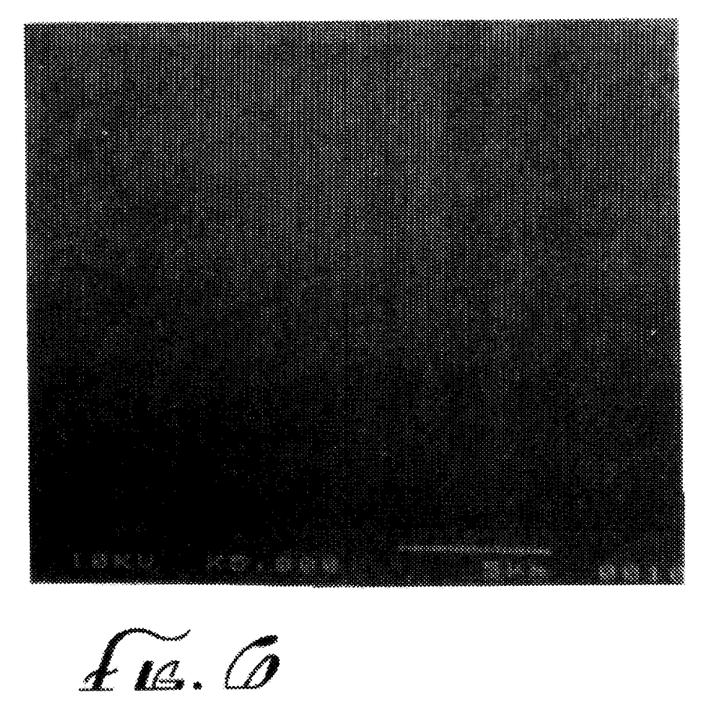
FIG. 6 is an SEM photomicrograph of a smooth, facetted diamond film prepared in the presence of helium.

FIG. 6 shows a very smooth coating obtained with 5% He added to the hydrogen, the surface roughness being 500 Å in comparison with 5000 Å for the faceted surfaces and 6000 Å for the cauliflower surface shown in FIGS. 2 and 5. The ratio of the (220) peak to the (111) peak is higher than shown in FIGS. 3. This unique film obtained with He present is possibly due to an increase in the total carbon content in the gas phase caused by more efficient physical sputtering of the carbon cathode surface as a result of the similarity in the atomic masses of helium and carbon.

Figure 7:
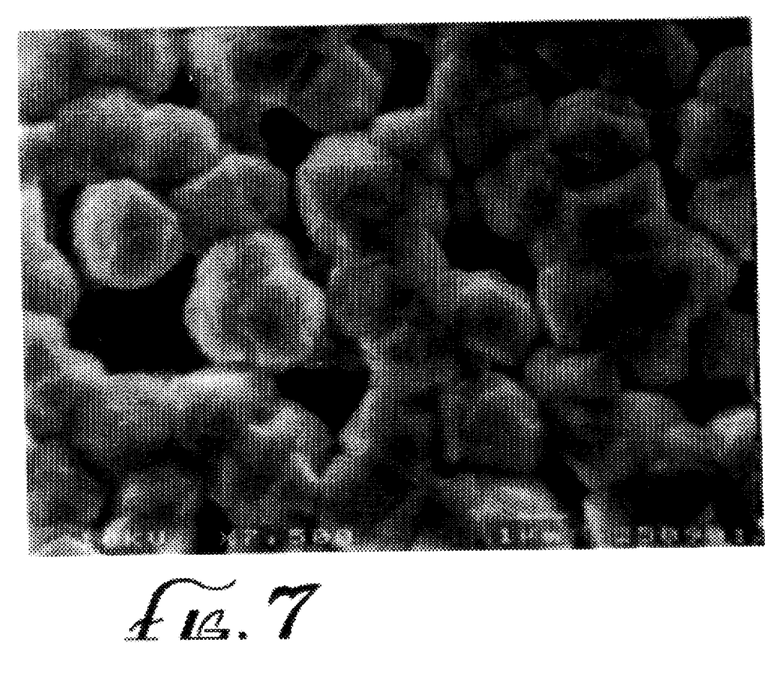
FIG. 7 is an SEM photomicrograph of a well facetted, multiple twinned diamond film prepared in flowing hydrogen.
Figure 8:
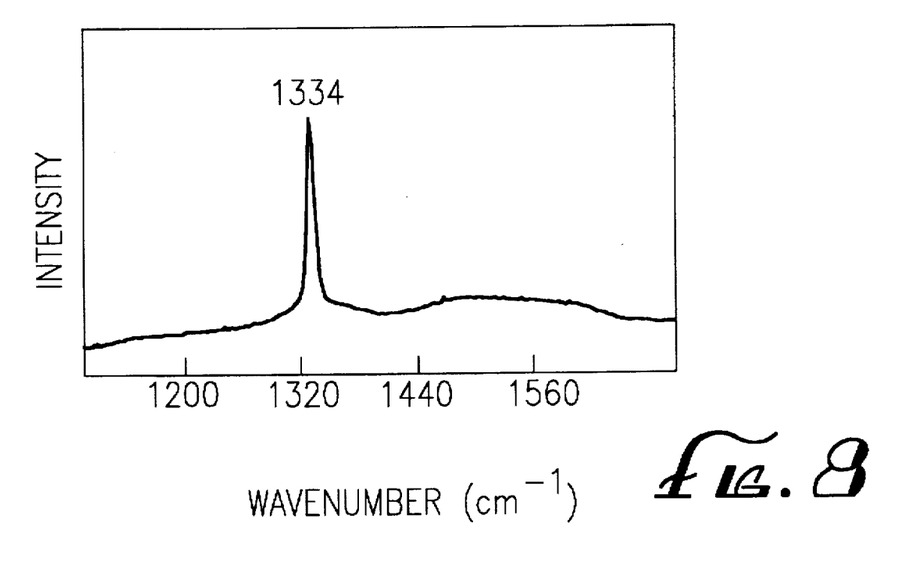
FIG. 8 is a graph showing the Raman spectra for the diamond film of FIG. 7.

FIG. 7 shows an SEM photomicrograph of a diamond film deposited at 100 Torr in flowing hydrogen at 30 sccm, with 1.1 A and a 435V discharge. The film shows well-faceted multiple twinned micro-crystals with a Raman peak at 1334 $cm^{-1}$, an FWHM of 7.9 $cm^{-1}$, reduced amorphous carbon signal when compared with FIG. 4, i.e., a higher diamond content, and therefore a somewhat improved quality over the films obtained in a static flow system.

EXAMPLE 1

Two graphite rods (Unocal Poco graphite), 2.5 cm and 1 cm in diameter respectively, were installed vertically in a 30 cm diameter Pyrex cylinder 46 cm long, the larger diameter rod being the cathode and the smaller being the anode. With the tips of the rods spaced 0.6 cm apart substrates with various surface treatments were attached to the anode using colloidal silver or colloidal graphite paste. An electrically insulated vacuum feed-through was used to connect the cathode to an RF Plasma Products SPS 5000 dc power source. A mechanical pump was used to reduce the pressure of the chamber to $2.66 \times 10^{-2}$ mbar (20 mTorr). The system was then backfilled to 100 Torr using 99.999% hydrogen, pumped down to 100 mTorr three times, and then hydrogen was bled into the system until 100 Torr pressure was reached and the flow was terminated. A hydrogen plasma was initiated between the anode and cathode by the high voltage circuit in the power supply. The cathode surface temperature was measured by an optical pyrometer to be about 950° C. and the anode/substrate surface temperature was measured to be about 700°–850° C. by a thermocouple. The carbon was transported from the cathode to the anode/substrate. The discharge voltage and current were 450 V dc and 1.1 amp respectively. It was found that diamond films could be deposited on silicon, magnesium oxide, copper and graphite substrates. The films generated were analyzed by micro-Raman spectroscopy, X-ray diffraction and SEM. The nucleation density of diamond on bare silicon and silicon surfaces coated with diamond-like carbon, fullerene-rich soot, silicon carbide or magnesium oxide, observed by SEM photomicrographs are listed in Table 1.

TABLE 1

| Diamond nucleation density on silicon substrates | | |
|---|---|---|
| | Nucleation density #/$cm^2$ | |
| Type of substrate | PECT | PRIOR ART |
| Bare silicon (100) | $10^6$–$10^7$ | $10^4$–$10^6$ |
| Diamond powder polished silicon | $10^7$–$10^8$ | $10^6$–$10^8$ |
| Fullerene-riched soot coated silicon | $1 \times 10^9$ | |

TABLE 1-continued

| Diamond nucleation density on silicon substrates | | |
|---|---|---|
| | Nucleation density #/$cm^2$ | |
| Type of substrate | PECT | PRIOR ART |
| Diamondlike carbon coated silicon | $3.9 \times 10^8$ | |
| Silicon carbide coated silicon | $1.8 \times 10^8$ | |
| Magnesium oxide coated silicon | $7 \times 10^8$ | |

It has also been found that a diamond film can be deposited on surfaces other than the substrate 14 mounted on the anode 16. For example, a floating substrate 48 positioned between and beside the space between the anode 16 and cathode 12 becomes coated with a diamond film.

The process as described above can also be adapted, as described below, to add a dopant to the diamond film during its formation. The addition of the dopant changes the properties of the film, particularly the physical and electrical properties, allowing the doped diamond film to be used for additional applications. For example, doped diamond films are useful as semiconductors of both the p-type and n-type. In order to add a dopant 50 to the diamond film during its formation several techniques have been developed to introduce a solid source of dopant 50 atoms into the plasma 31.

Figures 9, 10:
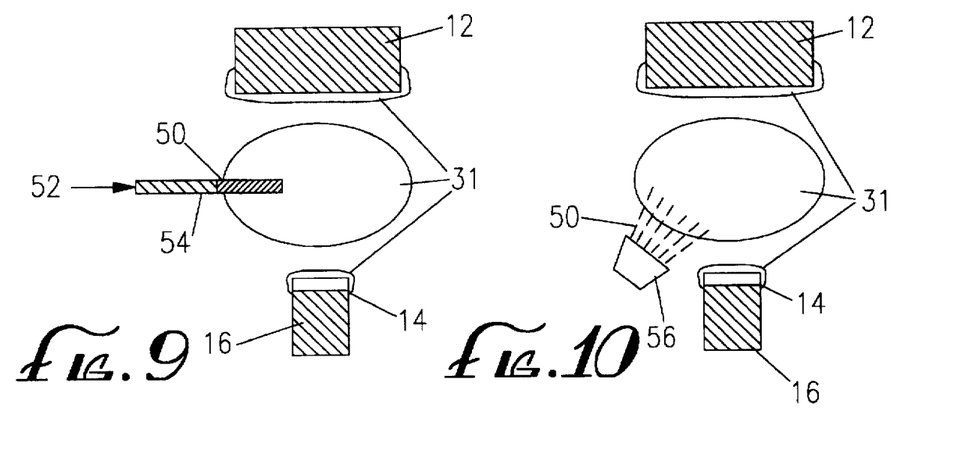
FIG. 9 is a first embodiment of a electrode and dopant source for forming a doped diamond film.
FIG. 10 is a second embodiment of a electrode and dopant source for forming a doped diamond film.

FIG. 9 shows a plasma heated source rod 52 surrounded by a tungsten coil 54. The tungsten coil 54 and the dopant are heated by the electrons, ions and neutral particles in the plasma 31. The dopant 50 is vaporized and transported with the carbon to the substrate 14. Suitable solid dopant sources are LiH, NaH, NaCl, $Na_2CO_3$, $P_2O_5$, $B_2O_3$, B and $B_4C$.

A second arrangement, shown in FIG. 10, utilizes a dopant material 50 which is vaporized from a crucible 56 located adjacent to the plasma 31 centered between the cathode 12 and anode 16.

Figure 11:
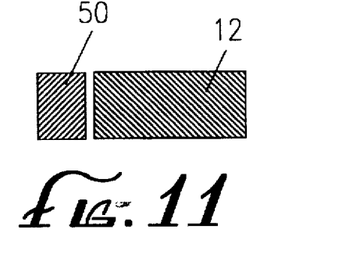
FIG. 11 is a first embodiment of a cathode arrangement for delivery of a dopant.
Figure 12:
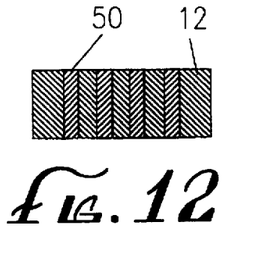
FIG. 12 is a second embodiment of a cathode arrangement for delivery of a dopant.
Figure 13:
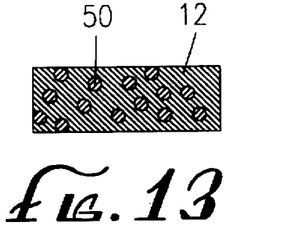
FIG. 13 is a third embodiment of a cathode arrangement for delivery of a dopant.

A third process is to sputter the dopant 50 along with the carbon by using a cathode 12 which incorporates the dopant 50 either in a second target 60 next to the carbon electrode 12 (FIG. 11), a single electrode having alternate layers of carbon and dopant 50 (FIG. 12) or a cathode 12 which incorporates the dopant 50 dispersed throughout the carbon cathode (FIG. 13). The structures shown in FIGS. 11, 12 and 13 have the added advantage that the ratio of dopant to carbon can be controlled in a desired range by preselecting the amount of dopant combined with the carbon in the cathode.

Figure 14:
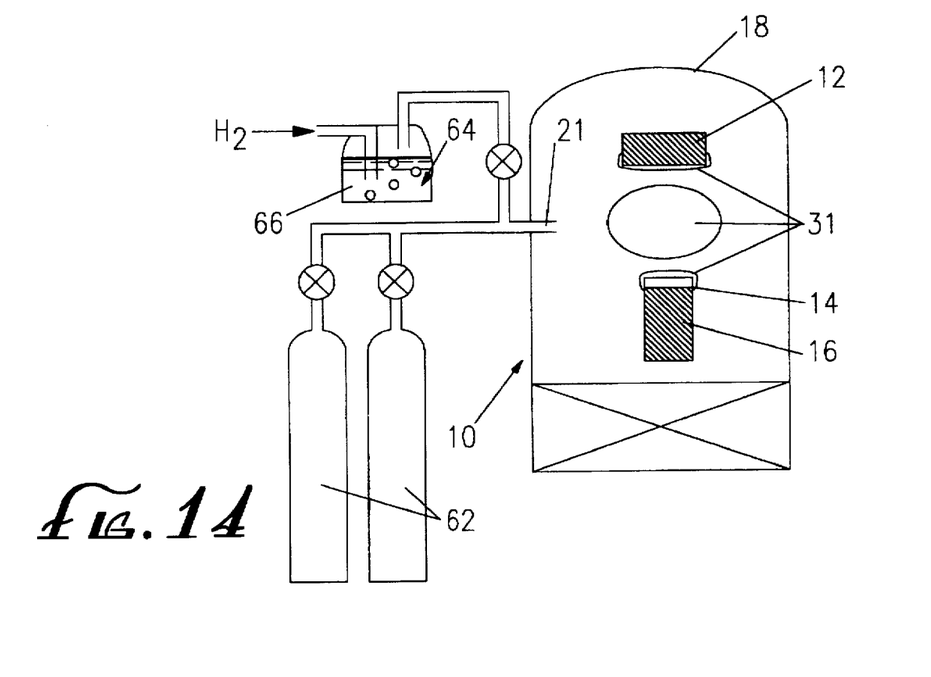
FIG. 14 is a schematic drawing of a doped carbon film production setup using a gaseous dopant compound.

It is also contemplated that gaseous dopant sources, such as used in CVD, MOCVD (metal organic chemical vapor deposition) or MBE (Molecular Beam Epitaxy) can be used. FIG. 14 shows a set up which allows dopant 50 containing reactant gases to be delivered from tanks 62 to a reaction vessel 64. The carrier gas (hydrogen) is then bubbled through the dopant mixture 66 and introduced into the plasma 31 in the deposition chamber 18. Examples of suitable gases are $BCl_3$, $PCl_3$, $(CH_3)PCl_2$, $CH_3Li$ and $C_4H_9Li$.

All four setups described above and shown in FIGS. 9–14 are usable to add dopants to the growing diamond film. The resistivity of the resultant film can then be measured by the use of a four point probe. Boron doped diamond films prepared using the arrangement shown in FIG. 9, depending on specific operating conditions, formed p-type semiconductors exhibiting resistivities ranging from $10^{-2}$ to $10^4$ $\Omega$cm, sodium doped films showed resistivity values of $10^3$ to $10^5$ $\Omega$cm and lithium doped films demonstrated n-type semiconductor properties with resistivities from 2.7 to $10^3$ $\Omega$cm.

Although the present invention has been described in considerable detail with reference to certain preferred versions and uses thereof, other versions and uses are possible. For example, while several dopants have been disclosed, various other elements may be incorporated into the diamond structure to form diamond films with semiconductor properties. N-type semiconductors contain mobile electrons, contributed by the dopant atom, such as phosphorus, and immobile positive charges. On the other hand, p-type semiconductors contain mobile, positive holes and immobile negative charges at the dopant atom, such as boron. However numerous other atoms can behave similarly. Therefore, it is possible that the other atoms in group 3a of the periodic chart (Al, Ga, In, and Tl) would be useful to dope diamond films to form p-type junctions and the other atoms in group 5a of the periodic chart (N, As, Sb, and Bi) would be useful to form n-type junctions. Additionally, the other atoms in group 1a of the periodic chart (Na and Li are discussed above) each have a single outer electron and could behave similarly. In a like manner the atoms in group 3b as well as numerous atoms in the Lanthanide and Actinide series, could behave in a manner similar to those in group 3a since they have 3 outer electrons and those in group 5b could behave in a manner similar to those in group 5a. Additionally, it is not necessary that the resultant diamond film have a single dopant. The process is amenable to delivering more than one dopant atom at a time and combinations of dopant materials can result in unique and previously unknown materials and properties.

Besides use as semiconductors, diamond films doped with various different atoms can also exhibit other unique electrical, magnetic, optical and physical properties. It is contemplated that certain dopants may result in the formation of superconducting materials. Also, because diamonds containing various different atoms, usually referred to as impurities, can have different colors as a result of the inclusions, it is also contemplated that the processes disclosed herein are useful for preparing various unique appearing materials for decorative and jewelry purposes or as crystals for use in laser systems. Therefore, the processes described herein to produce doped materials are not limited to that application but are contemplated to be useful for producing a broad range of diamond based films which have various unique applications. For example, while the cauliflower morphology may not be preferred for most applications, that morphology may be more desirable for other applications. Because the cauliflower morphology has a high surface area, and thus numerous points for charge distribution, it may be highly suited to cold cathode displays. Additionally, the PECT process is not limited to the production of a continuous diamond film. Powdered or single crystal pure or doped diamonds can be obtained by removing the partially coated substrate from the plasma and separating the coating from the substrate before a continuous film is formed.

Also, as indicated above, while preferred operating conditions and dimensions of the equipment have been described, the invention should not be considered to be limited by those operating parameters, the critical parameters being the pressure, the presence of a hydrogen plasma and the current density. Therefore, the spirit and scope of the appended claims should not be limited to the description of the preferred versions contained herein.

What is claimed is:

1. A plasma enhanced chemical transport process for the formation of a diamond film on a substrate, the substrate being located on or near an anode in a dc circuit, the substrate being spaced from a carbon cathode and the anode, the substrate and the cathode being located within a vacuum chamber consisting essentially of the steps of:
    a.) positioning the substrate at a distance from a lower surface of the cathode to form a gap of from about 0.4 to about 1.0 cm,
    b.) evacuating substantially all of the gases from the vacuum chamber and then introducing sufficient substantially pure hydrogen gas into the chamber to bring the pressure in the chamber to the range from about 80 Torr to about 180 Torr, and
    c.) applying a dc current to the circuit and across the gap between the anode and the cathode without the addition of an electron assisted discharge to form a hydrogen plasma in the gap, the current density at an upper surface of the anode being from about 0.5 to about 4.0 amp/cm$^2$.

2. The process of claim 1 wherein the pressure within the chamber is about from about 100 to about 120 Torr.

3. The process of claim 1 wherein the gap is about 0.6 cm.

4. The process of claim 1 wherein the current density at the anode is about 1.0 Amp/cm$^2$.

5. The process of claim 1 wherein dc voltage is from about 350 volts to about 470 volts and the current is from about 0.85 to about 1.2 amps.

6. The process of claim 1 wherein the substrate is selected from the group consisting of lattice matched, chemically compatible materials, carbide and carbide forming oxides and nitrides and metals suitable for use as substrates in diamond deposition processes.

7. The process of claim 1 wherein the substrate is selected from the group consisting of diamond, cubic-BN, Si, Ge, Mo, Ta, W, Al$_2$O$_3$, Si$_3$N$_4$, Au, Pt, Ni, and Cu.

8. The process of claim 1 wherein the hydrogen gas is continuously flowed through the chamber while maintaining the desired pressure within the chamber.

9. The process of claim 1 wherein the hydrogen gas is intermittently flowed through the chamber while maintaining the desired pressure within the chamber.

10. The process of claim 1 wherein the chamber is sealed after the hydrogen gas is introduced into the chamber.

11. The process of claim 1 wherein the diamond film produced is a continuous diamond film exhibiting an x-ray diffraction pattern with principal diamond peaks (111), (220) and (311), and a Raman spectra peak at 1334 to 1335 cm$^{-1}$.

12. The process of claim 1 wherein the diamond film produced is doped with lithium, said film having n-type semiconductor properties and a resistivity from about 2.7 to about 10$^3$ Ωcm.

13. The process of claim 1 wherein the diamond film produced is doped with boron, said film having p-type semiconductor properties and a resistivity from about 10$^{-2}$ to about 10$^4$ Ωcm.

14. The process of claim 1 wherein the diamond film produced is doped with sodium, said film having a resistivity from about 10$^3$ to about 10$^5$ Ωcm.

15. The process of claim 1 wherein the diamond film produced in doped with phosphorus, said film functioning as an n-type semiconductor.

16. The process of claim 1 wherein the substantially pure hydrogen is 99.999% hydrogen.

17. A plasma enhanced chemical transport process for the formation of a diamond film on a substrate, the substrate being located on or near an anode in a dc circuit, the substrate being spaced from a carbon cathode and the anode, the substrate and the cathode being located within a vacuum chamber consisting essentially of the steps of:

a.) positioning the substrate at a distance from a lower surface of the cathode to form a gap of from about 0.4 to about 1.0 cm, b.) evacuating substantially all of the gases from the vacuum chamber and then introducing sufficient substantially pure hydrogen gas and helium gas into the chamber to bring the pressure in the chamber to the range from about 80 Torr to about 180 Torr, the helium concentration being less then about 5% of the amount of gas in the chamber and c.) applying a dc current to the circuit and across the gap between the anode and the cathode without the addition of an electron assisted discharge to form a hydrogen plasma in the gap, the current density at an upper surface of the anode being from about 0.5 to about 4.0 amp/cm$^2$.

18. A plasma enhanced chemical transport process for the formation of a diamond film on a substrate, the substrate being located on or near an anode in a dc circuit, the substrate being spaced from a carbon cathode and the anode, the substrate and the cathode being located within a vacuum chamber consisting essentially of the steps of:

a.) positioning the substrate at a distance from a lower surface of the cathode to form a gap of from about 0.4 to about 1.0 cm, b.) evacuating substantially all of the gases from the vacuum chamber and then introducing sufficient substantially pure hydrogen gas containing up to about 5% helium gas into the chamber to bring the pressure in the chamber to the range from about 80 Torr to about 180 Torr, c.) placing a source of dopant atoms in the vacuum chamber such that the atoms of the dopant are transferred from the source and are incorporated into the diamond film as the film is formed, and d.) applying a dc current to the circuit and across the gap between the anode and the cathode without the addition of an electron assisted discharge to form a hydrogen plasma in the gap, the current density at an upper surface of the anode being from about 0.5 to about 4.0 amp/cm$^2$.

19. The process of claim 18 wherein atoms of the dopant are selected from the group consisting of group 1a, 3a, 3b, 5a, 5b, the lanthanide series and the actinide series of the periodic table of the elements.

20. The process of claim 18 wherein the source of the dopant atom is selected from the group consisting of LiH, NaH, NaCl, Na$_2$CO$_3$, P$_2$O$_5$, B$_2$O$_3$, B, B$_4$C, BCl$_3$, PCl$_3$, (CH$_3$)PCl$_2$, CH$_3$Li, C$_4$H$_9$Li and mixtures thereof.

* * * * *